United States Patent [19]
Fattaruso

[11] Patent Number: 6,150,893
[45] Date of Patent: Nov. 21, 2000

[54] VOLTAGE CONTROLLED OSCILLATOR WITH WIDE FREQUENCY RANGE AND LOW NOISE FOR INTEGRATED CIRCUIT FABRICATION

[75] Inventor: John W. Fattaruso, Dallas, Tex.

[73] Assignee: Texas Instruments Incorporated, Dallas, Tex.

[21] Appl. No.: 09/160,903

[22] Filed: Sep. 25, 1998

Related U.S. Application Data

[60] Provisional application No. 60/060,089, Sep. 26, 1997.

[51] Int. Cl.[7] .................................................. H03B 5/12
[52] U.S. Cl. ....................................... 331/117 R; 331/177
[58] Field of Search .......................... 331/117 R, 117 FE, 331/177 R

[56] References Cited

U.S. PATENT DOCUMENTS

| | | | |
|---|---|---|---|
| 3,963,996 | 6/1976 | Skerlos | 331/117 R |
| 5,479,137 | 12/1995 | Harford | 331/117 FE |

FOREIGN PATENT DOCUMENTS 0 702 452 A1  3/1996  European Pat. Off. .

OTHER PUBLICATIONS

"A 1.8–GHz Monolithic LC Voltage–Controlled Oscillator," Nguyen, et. al., *IEEE Journal of Solid–StaTe Circuits*, vol. 27, No. 3, Mar. 1992, pp. 444–450.

*Primary Examiner*—Siegfried H. Grimm
*Attorney, Agent, or Firm*—Ronald O. Neerings; Warren L. Franz; Richard L. Donaldson

[57] ABSTRACT

A voltage-controlled oscillator (10), which is comprised of two subcircuits (10a, 10b). Each subcircuit (10a, 10b) has a pair of differentially connected transistors (Q1,Q2 and Q3,Q4). The first subcircuit (10a) is an LC oscillation subcircuit, in which each transistor (Q1, Q2) has a capacitive transformer (C11,C12 and C21,C22) in its feedback loop. The second subcircuit (10b) is a current-controlled variable-capacitance subcircuit, whose feedback loop has a gain that determines the effective capacitance of the subcircuit (10b). When the subcircuits (10a, 10b) are combined, the feedback loops on each side of the differential pairs (Q1,Q2 and Q3,Q4) share the capacitive transformer (C11,C12 and C21, C22). The result is that the effective capacitance determines the oscillation frequency for the oscillator (10).

7 Claims, 2 Drawing Sheets

VOLTAGE CONTROLLED OSCILLATOR WITH WIDE FREQUENCY RANGE AND LOW NOISE FOR INTEGRATED CIRCUIT FABRICATION

This application claims priority under 35 USC § 119(e)(1) of provisional application No. 60/060,089, filed Sep. 26, 1997.

TECHNICAL FIELD OF THE INVENTION

This invention relates generally to integrated circuits, and more specifically, to a voltage controlled oscillator, which has a wide frequency range and low noise and which may be fabricated as an integrated circuit.

BACKGROUND OF THE INVENTION

The voltage controlled oscillator (VCO) is one of the building blocks of a frequency synthesis circuit. Discrete frequencies are accomplished with a phase-locked loop (PLL) synthesizer, which uses a VCO. The term "VCO" is used in a general sense, and includes oscillators where the frequency is under control of a current as well as those where the frequency is voltage-controlled.

Many of today's VCO's are at least partially solid state devices, having their transistor elements and some or all of their resistive, capacitive, or inductive components fabricated with semiconductor fabrication techniques. VCO circuits having all components fabricated within a single integrated circuit are referred to as "monolithic" circuits.

A problem with today's solid state VCO circuits is that they do not provide a wide frequency range with low phase noise. For applications such as cellular telephone transceivers, these characteristics are very important.

One approach to providing wide frequency range and low noise has been to use an LC oscillator circuit whose inductive or varactor elements are external to other integrated circuit components. However, this approach does not satisfy the additional need for small monolithic circuitry.

SUMMARY OF THE INVENTION

One aspect of the invention is a voltage-controlled oscillator (VCO) that is a combination of two subcircuits—an LC oscillation subcircuit and a current-controlled variable-capacitance subcircuit. A typical implementation of the VCO is in differential form, where each subcircuit has a pair of two differentially connected transistors. Thus, the full circuit has two "sides", each with a transistor for each subcircuit.

The LC oscillation subcircuit has a positive feedback loop, and the variable-capacitance subcircuit has a negative feedback loop. On each side of the VCO, the feedback loops of the two subcircuits share a common path for at least part of the loops. The shared portion includes a pair of series capacitors, which serve a dual role of providing a center tapped "capacitive transformer" for the LC oscillation subcircuit and of providing a variable capacitance for the variable capacitance subcircuit. As a result of this arrangement, the effective capacitance for VCO's LC tank is the product of the gain of the feedback loop times the capacitance of the series capacitors. This effective capacitance is what determines the oscillation frequency.

An advantage of the invention is that it permits monolithic fabrication of a VCO having low noise and a wide frequency range. An implementation of the VCO been simulated with a frequency range of 2030 to 2420 MHz, giving a total sweep range of 9.2% from 2030 MHz.

DETAILED DESCRIPTION OF THE INVENTION

Figure 1:
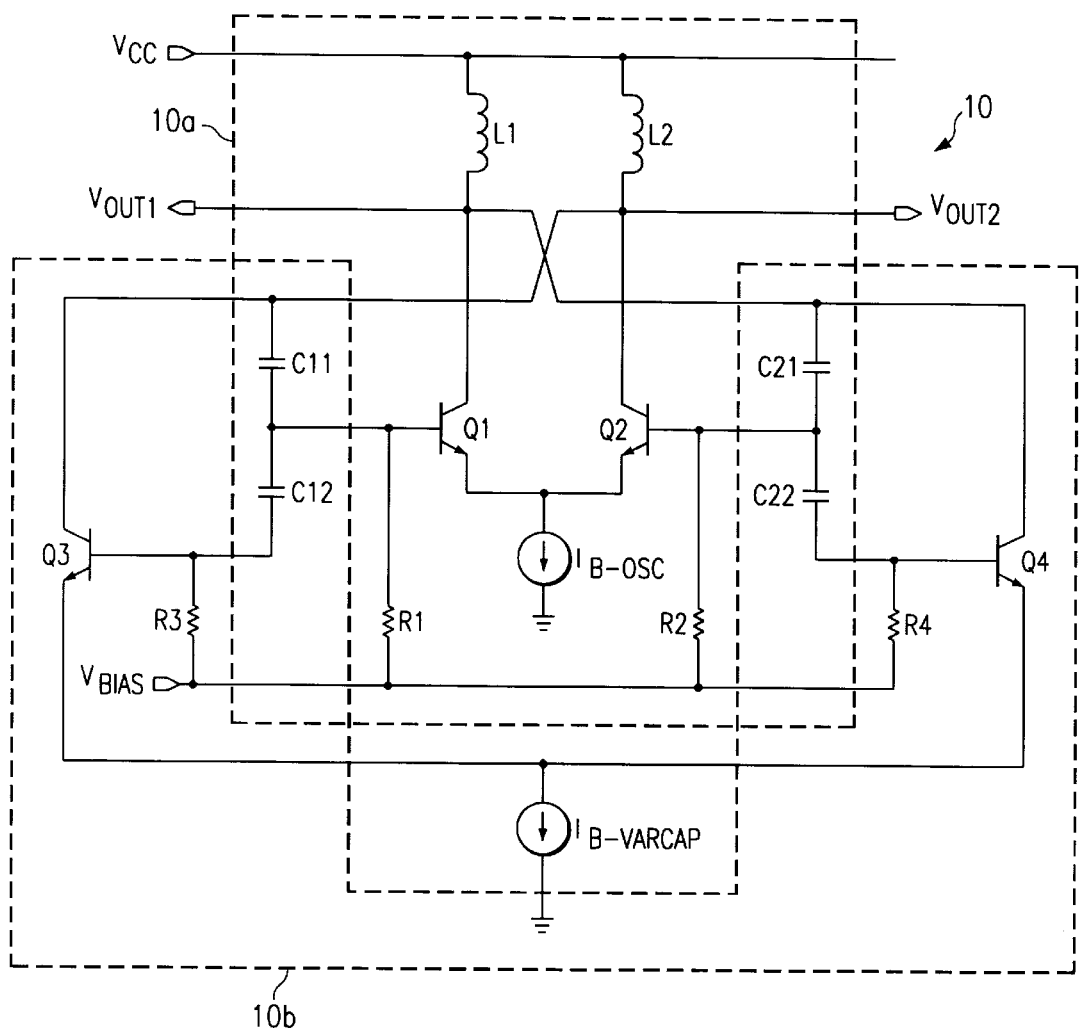
FIG. 1 illustrates a voltage controlled oscillator (VCO), implemented as a combination of a current-controlled variable-capacitance circuit and an LC oscillator circuit in accordance with the invention.

FIG. 1 illustrates a voltage controlled oscillator (VCO) circuit 10 in accordance with the invention. The term "VCO" is used herein in its broad conventional sense—in fact, as explained below, the oscillation frequency is controlled by a current not by a voltage as the name "VCO" may imply.

Circuit 10 can be analyzed as a meshing of two circuits—an LC oscillation circuit 10a and a current-controlled variable-capacitance circuit 10b. The variable-capacitance subcircuit 10b synthesizes a wide capacitance range in the LC tank circuit of the LC oscillation circuit 10a.

In the embodiment of FIG. 1, circuit 10 uses bipolar transistors, Q1, Q2, Q3, and Q4. In alternative embodiments, circuit 10 could be implemented with a field effect transistor in place of each bipolar transistor. Both embodiments can be fabricated using semiconductor fabrication techniques, resulting in a monolithic integrated circuit.

The LC oscillation subcircuit 10a within circuit 10 is comprised of transistors Q1 and Q2, capacitors C11, C12, C21, and C22, inductors L1 and L2, and resistors R1 and R2. Transistors Q1 and Q2 are differentially connected, that is, they are coupled through their emitters to a tail current source, $I_{B\text{-}osc}$.

The LC oscillation subcircuit 10a is based on a stand-alone fully-differential LC oscillator circuit, in which a capacitive transformer provides a voltage step-down function in a feedback loop. For example, on the "left" side of the subcircuit, the transformer comprises capacitors C11 and C12, which have a middle tap to provide a step-down voltage from Vout2 to the voltage into the base of Q2. Voltage Vout2 and the impedance into C11 are scaled in the same manner as a magnetic transformer.

The feedback loops of the LC oscillation subcircuit 10a are implemented by feeding back the output at the collector of one transistor output (Q1 or Q2) through the capacitive transformer and into the base of the other transistor (Q2 or Q1). The oscillation amplitude will grow until the loop gain at the fundamental frequency is limited by the nonlinearity of the differential pair of transistors Q1 and Q2.

The LC oscillation subcircuit 10a of FIG. 1 is but one variation of an LC oscillation circuit and other variations could be used in circuit 10. Other suitable LC oscillation circuits, without the variable-capacitance subcircuit of circuit 10 are known, but have a more restrictive frequency range than circuit 10. Common characteristics of suitable LC oscillation circuits are the generation of a sinusoidal output voltage from a transistor collector (or drain) whose frequency is a function of an LC resonant tank circuit and that has a positive feedback to the transistor base (or gate).

The current-controlled variable-capacitance subcircuit 10b of circuit 10 is comprised of transistors Q3 and Q4, resistors R3 and R4, and capacitors C11, C12, C21, and C22. It is based on a stand-alone circuit that provides an electronically variable capacitance. Such circuits were implemented in the days of vacuum tubes as "reactance tube" circuits. When the transconductance, $g_m$, of such a circuit is implemented for small signals with a transistor, the effective value of capacitance over the circuit terminals can be made to vary over a wide range by varying the bias current.

The variable-capacitance subcircuit 10b is made differential by the use of pairs of opposing capacitors, resistors, and transistors. The transistors are coupled through their emitters to a tail current source, $I_{B\text{-}VARCAP}$.

Figure 2:
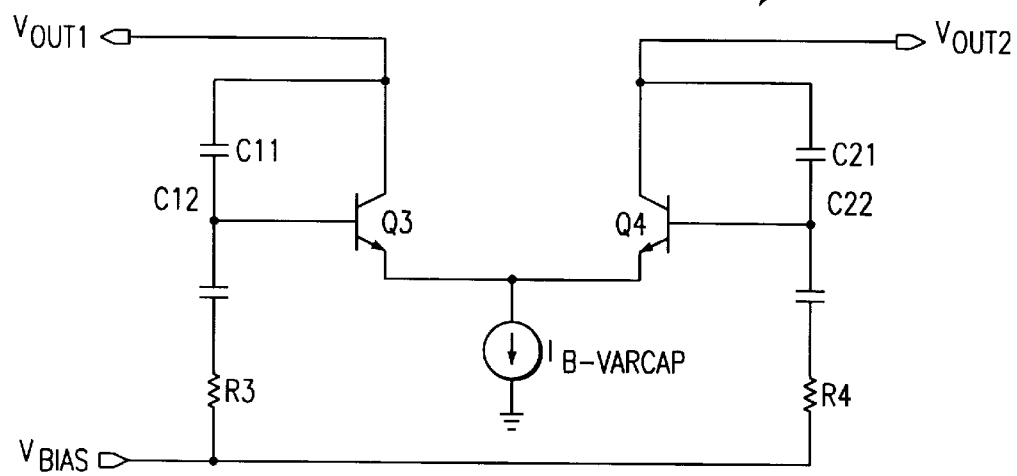
FIGS. 2 and 3 illustrate equivalent circuits to the current-controlled variable-capacitance circuit of FIG. 1.
Figure 3:
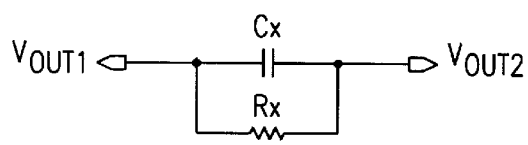

FIG. 2 illustrates a stand-alone circuit 20, which is equivalent to the variable-capacitance subcircuit 10b of FIG. 1. FIG. 3 is also an equivalent circuit, for small signals.

Referring to both FIGS. 2 and 3, for each feedback loop of the differential transistors Q3 and Q4, the effective capacitance, Cx, may be expressed mathematically as:

$$Cx = A(j\omega) \cdot C,$$

where $A(j\omega)$ is the loop gain and may be expressed as:

$$A(j\omega) = \frac{1 + g_m R}{1 + (\omega RC)^2}$$

The parameters C and R are the actual physical resistance and capacitance of the subcircuit.

Referring to both FIGS. 1 and 2, circuit 10 is designed for $\omega \ll 1/RC$, such that $A(j\omega) \sim 1 + g_m R$. Thus, $g_m$ is directly related to the loop gain of the variable-capacitance subcircuit 10b, which sets the effective capacitance. A typical range of values of $g_m R$ is 2 to 3.

In circuit 10, the capacitance C for the variable-capacitance subcircuit 10b is implemented by splitting the capacitance into two series capacitors. This permits the same transformer capacitors of the LC oscillation subcircuit 10a to be used to provide the capacitance for the variable-capacitance subcircuit 10b.

Thus, referring again to FIG. 1, when the LC oscillator subcircuit 10a and the variable-capacitance subcircuit 10b are combined to form the differential circuit 10, there are two pairs of series capacitors—a first pair comprising C11 and C12 and a second pair comprising C21 and C22. Each pair goes from collector to base of its associated transistor. The splitting of the capacitance permits circuit 10 to have a current-controlled variable capacitance as well as a center tap for the oscillator's capacitance ratio.

Voltage sources and current sources provide the input voltages, Vcc and $V_{BIAS}$, and tail currents, $I_{B\text{-}OSC}$ and $I_{B\text{-}VARCAP}$, respectively. As explained below, $I_{B\text{-}OSC}$ provides amplitude clipping and $I_{B\text{-}VARCAP}$ sets the oscillation frequency.

In operation, oscillator 10 sets up a positive feedback loop, which causes the oscillation amplitude to increase. The feedback loop comprises two "subloops". A first subloop is contributed by the LC oscillation subcircuit 10a, where L and C (effective) values control the oscillation frequency. A second subloop is contributed by the variable-capacitance subcircuit 10b, and it provides a value of C that is dependent on the $g_m$ of that circuit. In effect, the combining of the two subloops provides circuit 10 with a current-controlled variable-capacitor transformer for the LC tank. The dependency of the combined feedback loop on $g_m$ results in the wide frequency sweep for the circuit 10.

For each pair of series capacitors in a feedback loop, input capacitors C11 and C21 are smaller than capacitors C12 and C22. The result is a voltage reduction provided by the capacitor transformer, where the voltage at the inputs of the differential pair of transistors Q1 and Q2 is a replica of the voltage at the output but scaled down. A typical scaling down factor is in the range of 3–4. As an example, if oscillations were to grow to a point where 100 millivolts existed across the bases of Q1 and Q2, there would be 400–500 millivolts of oscillation at the output.

The oscillation frequency of circuit 10 is controlled by $I_{B\text{-}VARCAP}$. This is because $I_{B\text{-}VARCAP}$ sets the transconductance, $g_m$, of the variable capacitance circuit. Expressed mathematically for the case of bipolar transistors:

$$g_m = \frac{q\, I_{B-VARCAP}}{kT}.$$

Also, as explained above, the transconductance controls the loop gain and thus the effective capacitance of that circuit. This capacitance is the LC tank capacitance, which determines the oscillation frequency, f. Expressed mathematically:

$$f = \frac{1}{2\pi \sqrt{L\, C_{circuit}}},$$

where $C_{circuit}$ is equal to the effective capacitance of the feedback loop in the equation set out above. The physical capacitance, C, is the series capacitance:

$$C = \frac{C11\, C12}{C11 + C12}$$

Resistors R3 and R4 act as current sense resistors. Their resistance is small compared to the capacitor reactance. Thus, the "bottom" of each pair of series capacitors is ground, as would be the case for a conventional LC oscillation circuit.

The nonlinearity in circuit 10 to limit the amplitude is provided by amplitude clipping of the differential pair of LC oscillator circuit transistors, Q1 and Q2. The amplitude increases until the tail current, $I_{B\text{-}OSC}$ is switched between Q1 and Q2.

Figure 4:
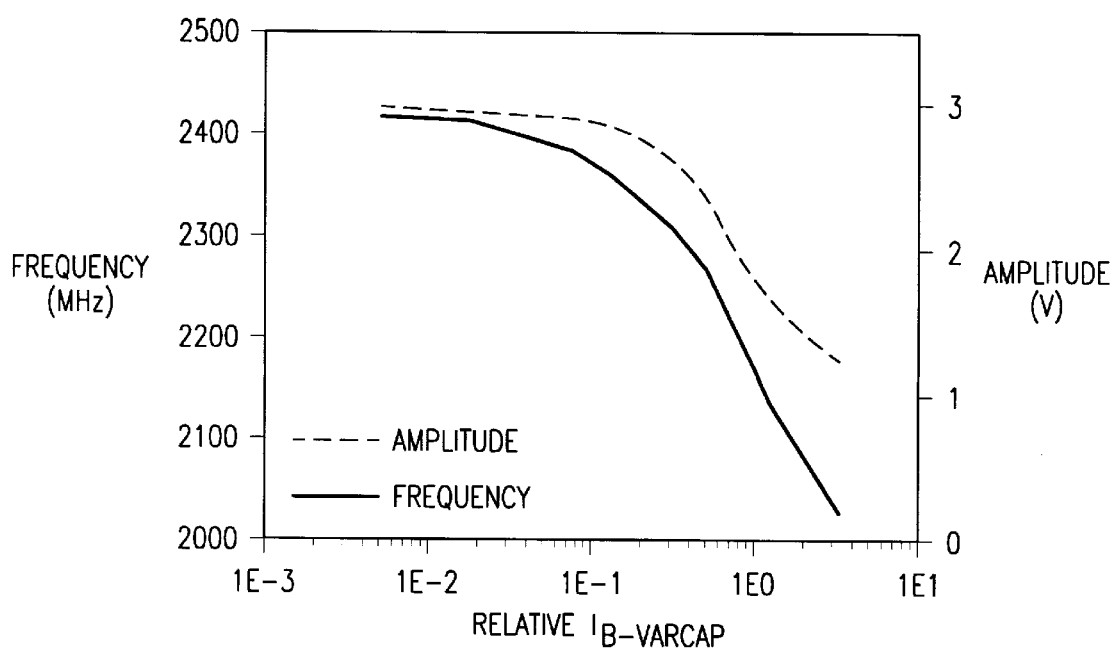
FIG. 4 illustrates the results of a simulation of a VCO in accordance with the invention.

FIG. 4 illustrates the results of a simulation of circuit 10. Gate capacitances were used to bypass the VDD supply and Vbias line. The simulation circuit also included a differential pair of transistors as an output buffer to drive the 50 ohm test equipment while approximately simulating a mixer load to the circuit connected at the taps of the capacitive transformer pairs C11,C12 and C21,C22. The frequency was measured at the buffer output.

The y axis of FIG. 4 is measured as a factor relative to the nominal level of $I_{B\text{-}VARCAP}$ of 10 mA. $I_{B\text{-}OSC}$ was set at a constant 10 mA, and 2 mA was supplied to the buffer differential pair. The total frequency range for the simulated circuit 10 is from 2030 to 2420 MHz, giving a total sweep range of 19.2% from 2030 MHz. FIG. 4 also plots the variation in oscillator amplitude over the sweep range. This amplitude is measured as the peak differential voltage between the nodes Vout1 and Vout2, depicted in FIG. 1.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A voltage controlled oscillator, comprising:

an LC oscillation subcircuit having a first differential pair of transistors, each having a first positive feedback loop through a capacitive transformer, each said capacitive transformer having two capacitors in series with a center tap to its associated transistor; and a current-controlled variable-capacitance subcircuit, having a second differential pair of transistors, each having a second feedback loop through said two capacitors in series;

where the effective capacitance of said variable-capacitance subcircuit varies with the gain of said second feedback loop.

2. The circuit of claim 1, wherein said transistors are bipolar transistors.

3. The circuit of claim 1, wherein said transistors are field effect transistors.

4. The circuit of claim 1, wherein said circuit is fabricated at least in part as an integrated circuit.

5. The circuit of claim 1, wherein said circuit is fabricated as a monolithic semiconductor circuit.

6. The circuit of claim 1, wherein each said pair of capacitors is substantially grounded by means of a current sense resistor.

7. The circuit of claim 1, where said second differential pair of transistors have a transconductance characteristic such that said gain is substantially equal to said transconductance times resistance in said feedback loop plus one.

* * * * *